US007227360B2

(12) United States Patent
Jevtic et al.

(10) Patent No.: US 7,227,360 B2
(45) Date of Patent: Jun. 5, 2007

(54) PHASED ARRAY MRI COIL WITH CONTROLLABLE COUPLED RING RESONATOR

(75) Inventors: Jovan Jevtic, West Allis, WI (US); Velibor Pikelja, Milwaukee, WI (US)

(73) Assignee: Invivo Corporation, Orlando, FL (US)

( * ) Notice: Subject to any disclaimer, the term of this patent is extended or adjusted under 35 U.S.C. 154(b) by 82 days.

(21) Appl. No.: 11/036,640

(22) Filed: Jan. 14, 2005

(65) Prior Publication Data

US 2006/0158187 A1 Jul. 20, 2006

(51) Int. Cl.
G01V 3/00 (2006.01)

(52) U.S. Cl. ........................................ 324/318; 324/322
(58) Field of Classification Search .................. None
See application file for complete search history.

(56) References Cited

U.S. PATENT DOCUMENTS

| | | | | |
|---|---|---|---|---|
| 2,476,311 | A | * | 7/1949 | Learned .......................... 331/9 |
| 4,763,074 | A | * | 8/1988 | Fox .............................. 324/314 |
| 5,194,811 | A | * | 3/1993 | Murphy-Boesch et al. . 324/322 |
| 5,412,322 | A | * | 5/1995 | Wollin ......................... 324/318 |
| 5,682,893 | A | | 11/1997 | Meyer et al. |
| 5,757,187 | A | * | 5/1998 | Wollin ......................... 324/306 |
| 5,777,474 | A | | 7/1998 | Srinivasan |
| 6,040,697 | A | * | 3/2000 | Misic ........................... 324/318 |
| 6,043,658 | A | * | 3/2000 | Leussler ....................... 324/318 |
| 6,396,273 | B2 | * | 5/2002 | Misic ........................... 324/318 |
| 6,411,090 | B1 | | 6/2002 | Boskamp |
| 6,501,274 | B1 | * | 12/2002 | Ledden ........................ 324/318 |
| 6,608,480 | B1 | * | 8/2003 | Weyers ........................ 324/318 |
| 6,714,013 | B2 | * | 3/2004 | Misic ........................... 324/318 |
| 6,831,460 | B2 | * | 12/2004 | Reisker et al. ............... 324/318 |
| 6,900,636 | B2 | * | 5/2005 | Leussler ....................... 324/318 |
| 6,995,561 | B2 | * | 2/2006 | Boskamp et al. ............ 324/318 |
| 7,012,429 | B1 | * | 3/2006 | Ledden ........................ 324/318 |
| 7,012,430 | B2 | * | 3/2006 | Misic ........................... 324/318 |

(Continued)

FOREIGN PATENT DOCUMENTS

EP 0631151 6/1994

(Continued)

OTHER PUBLICATIONS

Scott B. King, et al., A Four Channel Transceive Phased Array Head Coil for 3T, Proc. Intl. Soc. Mag. Reson. Med 9 (2001) Gainesville, Florida.

(Continued)

*Primary Examiner*—Brij Shrivastav
*Assistant Examiner*—Tiffany A. Fetzner
(74) *Attorney, Agent, or Firm*—Boyle Fredrickson Newholm Stein & Gratz S.C.

(57) ABSTRACT

A coil for magnetic resonance imaging operates in a transmit mode with multiple loops locked together in a phase relationship like a birdcage coil to provide a uniform transmission field, but in a receive mode like a phased array coil, each coil operating independently to produce a separate signal for reception by the MRI machine. Phasing of the coil during transmit mode is provided by a ring resonator controllably coupled to the loops. Controllable coupling is provided by a series of current limiting elements interposed between the resonant ring and the loops of the coil.

18 Claims, 2 Drawing Sheets

U.S. PATENT DOCUMENTS

| | | | |
|---|---|---|---|
| 2003/0062894 A1* | 4/2003 | Vester | 324/307 |
| 2003/0071622 A1* | 4/2003 | Reisker et al. | 324/318 |
| 2003/0184293 A1* | 10/2003 | Boskamp et al. | 324/318 |
| 2003/0201775 A1 | 10/2003 | Boskamp | |
| 2004/0155656 A1* | 8/2004 | Leussler | 324/318 |
| 2004/0155657 A1* | 8/2004 | Misic | 324/318 |
| 2005/0099179 A1* | 5/2005 | Monski et al. | 324/318 |
| 2005/0140369 A1* | 6/2005 | Feiweier et al. | 324/318 |

FOREIGN PATENT DOCUMENTS

| | | |
|---|---|---|
| WO | WO 2004/048987 | 6/2004 |

OTHER PUBLICATIONS

Jevtic, J., Pikelja, V., "High Impedance Power Splitter for Transmitting Phased-Array Coils," Proceedings of the International Society for Magnetic Resonance in Medicine, ISMRM 13th Annual Meeting and Exhibition, Miam Beach, Florida, USA May 7-13, 2005, p. 324, XP002381599.

* cited by examiner

PHASED ARRAY MRI COIL WITH CONTROLLABLE COUPLED RING RESONATOR

CROSS-REFERENCE TO RELATED APPLICATIONS

- -

STATEMENT REGARDING FEDERALLY SPONSORED RESEARCH OR DEVELOPMENT

- -

BACKGROUND OF THE INVENTION

The present invention relates generally to magnetic resonance imaging (MRI) and in particular to local coils for use in MRI.

In magnetic resonance imaging, a uniform magnetic field is applied to an imaged object, for example, a patient and a radio frequency (RF) excitation signal pulse is applied to excite nuclei within the patient into resonance. This RF excitation pulse will also referred to herein as a "transmit" signal.

After application of the transmit signal, one or more magnetic gradient fields are superimposed on the uniform magnetic field to spatially encode the precessing nuclei, and nuclear magnetic resonance (NMR) signal from the nuclei are received and processed mathematically to produce an image. The NMR signal will also be referred to herein as a "receive" signal.

The transmit and receive signals may be transmitted and received by loop antennas termed "coils", such as a whole body coil built into the MRI machine to encompass the entire patient.

Improvement in the signal-to-noise ratio of the receive signal can be obtained by placing "local coils" on the patient. The local coil has a smaller reception pattern than a whole body coil and therefore can focus on a smaller region of interest to obtain a stronger signal and to receive less noise. Locals coils may also provide improved application of the transmit signal.

A common local coil design is the "birdcage" coil which provides two conductive rings separated along a common axis to define the two bases of a cylindrical volume. A number of conductive axial struts are spaced regularly about the circumference of rings to join the rings. The rings may be excited into resonance at the transmit signal frequency so that a traveling wave progressively promotes current flow in each of the struts to produce a highly uniform rotating magnetic vector within the cylindrical volume. The same coil can be used to collect the receive signal, the rings serving to combine the signals from each of the struts inducted by the rotating magnetic vector of the nuclei.

Phased array local coils are multiple loop local coils where the outputs from each loop are independent and may be processed independently to improve signal-to-noise ratio or to obtain additional spatial information. The loops of a phased array coil may be arranged about a cylindrical volume, and thus may resemble and provide similar coverage to a birdcage coil, but unlike the birdcage coil, the phased array coil provides multiple independent signals to the MRI machine in contrast to the birdcage coil which provides a signal as a combination of the current flows in each strut.

In order to obtain independent electrical signals from each loop, a phased array coil must normally provide decoupling between the loops. This decoupling may employ a controlled overlap between adjacent loops or capacitive decoupling networks or the like.

While phased array coils provide advantages for the reception of the receive signals (receive mode), a standard birdcage structure can provide a more uniform field for transmitting the transmit signal (transmit mode). Accordingly, there is considerable interest in creating a hybrid local coil that may operate as a birdcage coil while transmitting and, as a phased array coil when receiving.

Another approach is to combine the physical structures of the phased array coil and birdcage coil in two concentric arrays. One array is activated during transmission and the other during reception. This approach increases the weight and size of the coil and interaction between the two arrays can interfere with the uniformity of the field and/or reduce the signal-to-noise ratio of the received signals.

An alternative approach connects each of the loops of the phased array coil directly with the output to a different phase shifter providing phase shifted transmit signals mimicking the phase shifting provided by the birdcage coil end rings. Unfortunately, variations in the loading of each loop often result in widely differing loop currents creating transmit field distortions that result in poor performance for phase sensitive MRI techniques such as fat saturation sequences.

Variations in the current flows from each phase shifter can be controlled by the addition of a radio frequency amplifier between the phase shifter and each loop. This approach is expensive and significantly increases the bulk and weight of the coil and for this reason may be practical only for whole body coils.

BRIEF SUMMARY OF THE INVENTION

The present invention provides a ring resonator, analogous to the end rings of a birdcage coil, that may be controllably coupled to phased array loops during transmission to produce an extremely uniform excitation field and, then disconnected to allow the loops to operate independently for a reception. Coupling between the ring resonator and the loops is controlled through a set of passive, power-limiting circuits overcoming the problems of phase distortion caused by variation in the loading of the loops by nearby body tissue and the dielectric resonance effects at ultra-high MRI frequencies corresponding to magnetic field strengths of 3 Tesla and higher.

Specifically, the present invention provides a local coil for use with magnetic resonance imaging systems having a set of MRI antenna loops supported about a patient and a set of transmit receive switches alternatively connecting the loops to a transmit signal from the MRI system and to multiple receive inputs to the MRI system. A ring resonator provides a series of phase splitting taps that are connected through passive power-limiting circuits to each of the loops.

Thus it is one object of at least one embodiment of the invention to provide a uniform transmit field, while reducing of phase distortion caused by large variations in coupling to the ring resonator by the different loops.

The power-limiting circuits may provide a non-reactive current limiter.

Thus it is an object of at least one embodiment of the invention to provide a phase splitting circuit that acts like a current source and which does not de-tune the ring resonator.

The power-limiting circuits may be 90-degree, phase shifting circuits.

Thus it is another object of at least one embodiment of the invention to make use of a well-understood circuit that can transform a low impedance at the ring resonator to a high impedance at the loops to provide current limiting.

The ring resonator may include N phase shifting elements connected in series in a ring. The ring need not be circular.

Thus it is another object of at least one embodiment of the invention to provide a simple, discrete element implementation of the ring resonator that is more compact than the ring used in a conventional birdcage coil.

The phase shifting elements may be links of coaxial cable.

Thus it is another object of at least one embodiment of the invention to provide robust, low loss phase shifting element that may be readily fabricated.

The inductance required by the 90-degree phase shift circuit used as a power limiter may be lumped into the inductance of the coaxial cable to eliminate a separate inductor.

Thus it is another object of at least one embodiment of the invention to decrease the resistive loss associated with the use of a discrete inductor in the power-limiting circuit.

The phase shifting elements may provide for equal phase shifts or different phase shifts summing to 360 degrees.

Thus it is an object of at least one embodiment of the invention to provide for a variety of coil designs where the loops may or may not be spaced at equal angular intervals about the patient.

Each power-limiting circuit may have the same electrical characteristics to provide equal coupling between the ring resonator and the loops or may provide for different electrical characteristics to provide for different couplings to at least one loop.

Thus it is another object of at least one embodiment of the invention to allow the adjustment of current through different loops of the coil.

The coil may include an interface circuit between the MRI machine and the ring resonator coupling the transmit signal to the ring resonator and also coupling combined NMR signals from the loops to the ring resonator.

Thus it is an object of at least one embodiment of the invention to provide a coil that may operate both in phased array reception mode and also in a birdcage coil-like reception mode in which the signals from the loops are combined by the ring resonator. This latter mode may be useful for calibration purposes of the coil.

These particular objects and advantages may apply to only some embodiments falling within the claims and thus do not define the scope of the invention.

DETAILED DESCRIPTION OF THE PREFERRED EMBODIMENT

Figure 1:
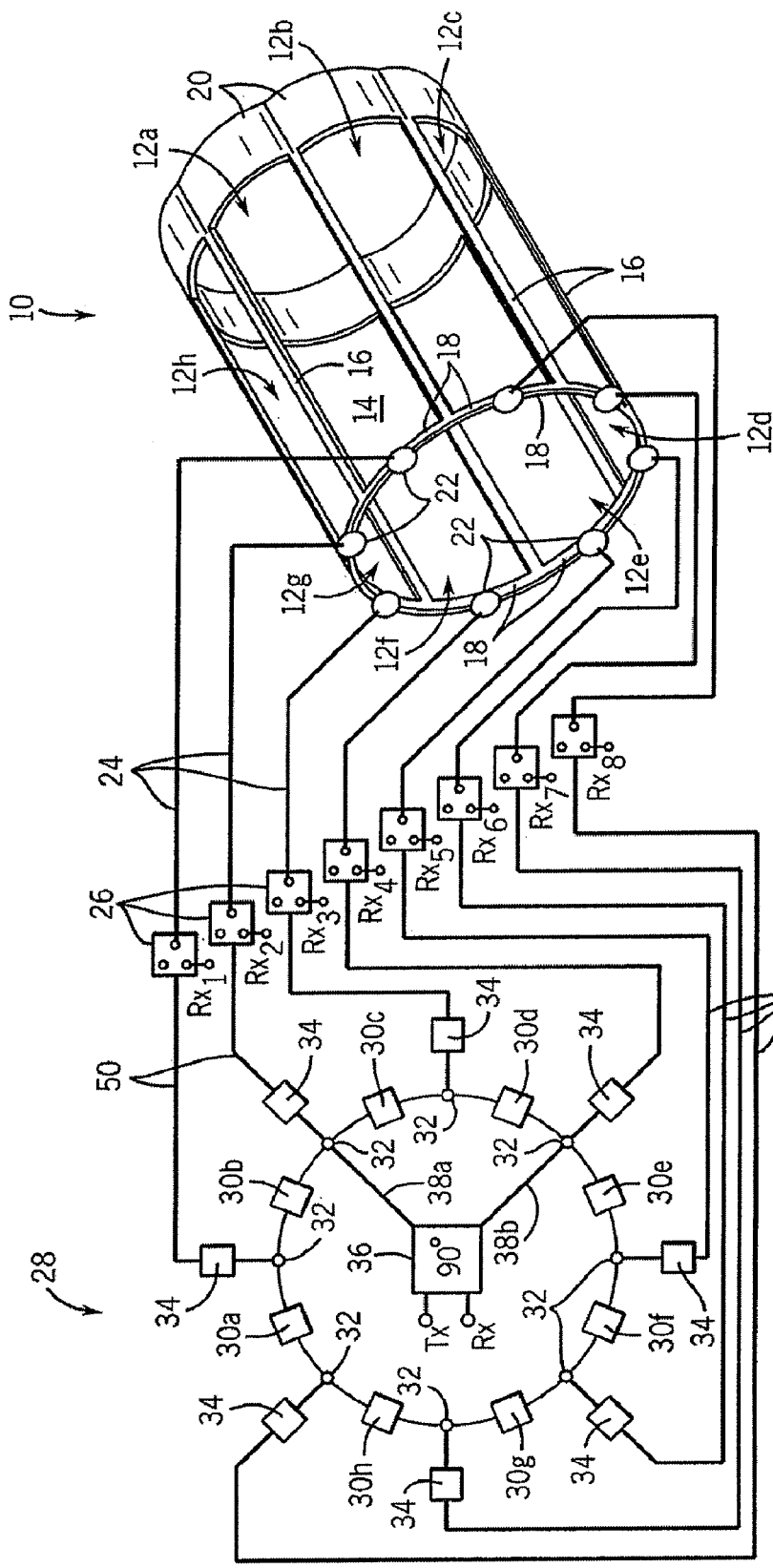
FIG. 1 is a schematic diagram of the present invention showing a ring resonator coupled to loops of a head coil to provide for different modes of transmission and reception.

Referring now to FIG. 1, a head coil 10 suitable for use with the present invention may provide for a series of rectangular conductive loops 12a–12h arrayed about a cylindrical volume 14 to follow the curved circumference of the cylindrical volume.

Each loop 12 includes axial struts 16 which may be shared by adjacent loops 12 and circumferential struts 18 at one end and circumferential struts 20 at a second end of the volume 14.

The circumferential struts 20 include capacitive de-coupling circuitry reducing the coupling between adjacent loops 12 as described in U.S. patent application Ser. No. 10/122, 476 filed Apr. 12, 2002, and assigned to the same assignee as the present invention and hereby incorporated by reference.

Circumferential struts 18 include loop interface circuits 22 which each provide an electrical coupling to a loop 12a–12f so that transmit signals may be input to the loops 12a–12f and receive signals may be collected from the loops 12a–12f.

Each of the loop interface circuits 22 connects to an associated lead 24 which may connect to a pole of a single pole, double throw transmit/receive switches 26, the number of transmit/receive switches 26 being equal in number to the number of loops 12. While the transmit/receive switches 26 are shown as mechanical switches, it will be understood to one of ordinary skill in the art that these switches normally will be implemented through diode-type switching circuits known in the art in which a switching signal from the MRI system biases diodes into conduction to effect the switching between throws.

The pole of each transmit/receive switch 26 may alternately connect to a first throw (as shown in FIG. 1) communicating to a ring resonator 28 via coaxial cable 40 as will be described below, or to a second throw associated with a terminal labeled Rx.sub.1–Rx.sub.8 in FIG. 1, the latter communicating with separate input lines of the MRI system (not shown). During a transmit mode, each transmit/receive switch 26 will connect to the first throw as shown in FIG. 1 so that signals may pass from the ring resonator 28 to the individual loops 12a–12h. Normally during a receive mode, each transmit/receive switch 26 will connect to the second throw and to terminals R.sub.X1 through R.sub.X8 so that the independent signals from each of the loops 12a–12h may pass to the inputs for phased array reception of the MRI machine.

Referring still to FIG. 1, the ring resonator 28 provides a set of phase shift elements 30a through 30h connected in series and in a ring so that the sum of the phase shifts as one passes around the ring through each phase shift element 30a through 30h totals substantially 360 degrees. In an 8-loop design shown in FIG. 1, there will be eight phase shift elements 30, each having a phase shift of approximately 45 degrees.

In between each phase shift element 30, at the junctions of adjacent phase shift elements 30, are phase splitting taps 32. The ring resonator 28 may be excited into resonance by a transmit signal Tx received from the MRI machine and passed through an input of a 90-degree quadrature splitter/combiner 36 of a type well known in the art producing two outputs 38a and 38b having a 90-degree phase difference.

These outputs will be attached appropriate taps 32 having a corresponding 90-degree phase separation along the ring. In this case, the outputs 38a and 38b are attached to the taps 32 separated by the two phase shift elements 30c and 30d.

The transmit signal Tx may thus be received by the 90-degree quadrature splitter/combiner 36 and coupled to the ring resonator 28 to create a traveling wave about the ring resonator 28 providing for a series of phase shifted outputs at each phase splitting tap 32.

Each phase splitting tap 32 is coupled through a power-limiting element 34 and cable 50 to the first throws of the transmit/receive switches 26 and thus, during the transmit mode, to particular loops 12.

The 90-degree quadrature splitter/combiner 36 also provides an output optionally providing, under certain conditions, a receive signal Rx. This receive signal Rx is obtained by holding the transmit/receive switches 26 in a state of connection to the first throws during the receive phase of the MRI acquisition. In this case, the ring resonator 28 combines signals received through each of the power-limiting elements 34 in the manner analogous to a standard head coil. This mode may be used for calibration of the MRI system, for example, by obtaining images of a water phantom placed within the volume 14 as the mode may provide improved homogeneity possibly at the expense of signal-to-noise ratio desirable for such calibration procedures.

Figure 2:
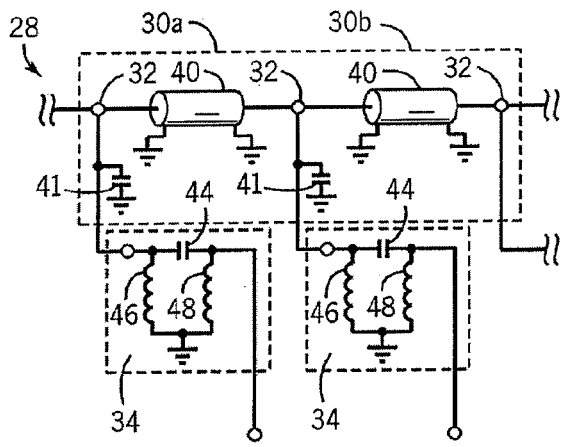
FIG. 2 is a detailed schematic representation of the ring resonator of FIG. 1 showing the use of discrete elements of coaxial cable and the circuitry of a 90-degree phase shifter used as the power-limiting element.

Referring now to FIG. 2, each of the phase shift elements 30a–30h may be a short segment of coaxial cable 40 providing by virtue of its distributed characteristics and length, the necessary phase shift from one end to the other. These segments of coaxial cable 40 may be connected in series in a compact configuration, for example, in a single linear configuration eliminating the need for a bulky circular ring. As is understood in the art, each segment of coaxial cable 40 provides a distributed inductance and capacitance that serves to produce the desired delay through a center conductor when an outer shield is grounded. The distributed inductance of the segments of coaxial cable 40 may be augmented by capacitors 41 connecting taps 32 to ground as will be understood to those of ordinary skill in the art.

Figure 3:
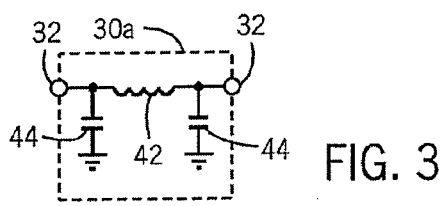
FIG. 3 is a detail of FIG. 2 showing a replacement of the coaxial cable with a standard pi-network phase shift element.

Referring now to FIG. 3, alternatively, the phase shift elements 30 may be provided by single pi-networks in which an inductor 42 is connected between the taps 32. The inductor 42 is flanked by capacitors 44 leading to ground. Other phase shift networks may also be possible.

Referring still to FIG. 2, the power-limiting elements 34 may be 90-degree phase shift circuits formed of a capacitor 44 connecting between each tap 32 at an input terminal of the power-limiting element 34, and the first throw of each transmit/receive switch 26 at an output terminal of the power-limiting element 34. An inductor 46 connects the input terminal of the power-limiting elements 34 to ground and an inductor 48 connects the output terminal of the power-limiting elements 34 to ground. 90-degree phase shift circuits of this type are well known in the art.

An advantage to the 90-degree phase circuit is that it presents a neutral or non-reactive impedance to the loop formed of the phase shift elements 30a through 30h and that it converts the impedance at this loop to a high impedance as seen from each of the loops 12. This impedance seen from each loop 12 is substantially higher than the impedance of the loops 12 thus providing for an effective current limiting caused by the fact that changes in the impedance of loops 12 caused by variations in patient loading and inter-loop coupling are slight with respect to the impedance of the power-limiting elements 34, and thus do not significantly affect current flow through the power-limiting elements 34. The effect is to control the coupling between the loops 12 and the ring resonator 28 by the creation of an effective current source therefrom.

Figure 5:
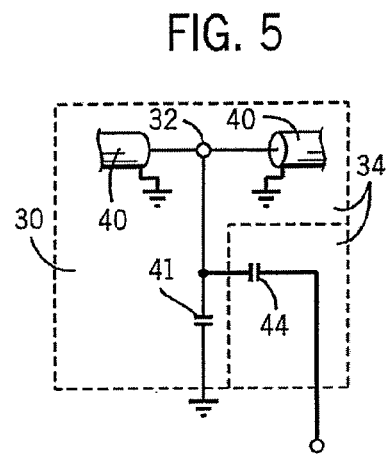
FIG. 5 is an alternative implementation of the power-limiting circuit of FIG. 2 in which the inductance of FIG. 2 has been absorbed into the inductance of the coaxial elements in order to reduce electrical losses.

Referring to FIG. 5, an alternative implementation of the power-limiting circuit shown in FIG. 2 in which the inductance of FIG. 2 has been absorbed into the inductance of the coaxial elements in order to reduce electrical losses is shown. Referring to FIGS. 2 and 5, the inductor 46 of the power-limiting elements 34 may be absorbed into the inductance naturally present in the segments of coaxial cable 40 thus eliminating the losses of the independent inductor. Equivalently, the inductor 48 of the power-limiting elements 34 may be absorbed into the inductance naturally present in the segments of coaxial cable 40.

Figure 4:
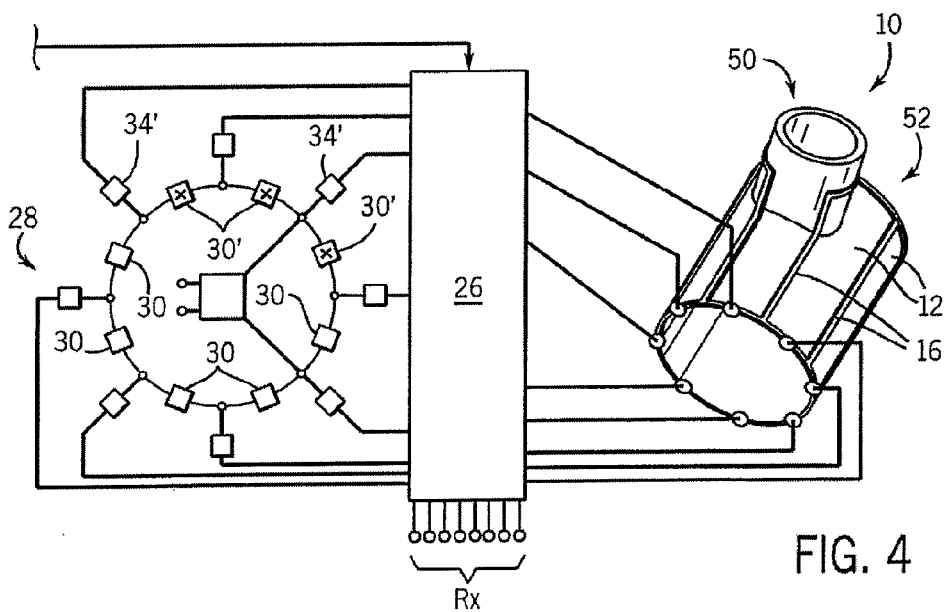
FIG. 4 is a schematic similar to that of FIG. 1 showing application of the invention to a knee/foot coil in which different amounts of phase shifting and coupling may be desired for different coils.

Referring now to FIG. 4, the coil 10 need not be a head coil but, for example, may be a knee/foot coil such as that described in U.S. Pat. No. 5,277,183 entitled: "NMR Local Coil For Foot Imaging" and U.S. Patent Publication 20040220469 entitled "Knee-Foot Coil With Improved Homogeneity" assigned to the assignee of the present invention and hereby incorporated by reference. In these designs, there may be some variation in the angular spacing of the struts 16 as they are placed on a form that provides for intersecting hollow tubes communicating at their intersection, in this instance, to provide for a chimney portion 50 extending upward from a tubular foot holding portion 52, the former allowing extension of the patient's toes upward while the ankle and remainder of the foot are enclosed in the tubular foot holding portion 52. Variation in angular spacing of the struts 16 may be readily accommodated by changing the phase shifts of certain of the phase shift elements 30' in contrast to phase shift elements 30 connected to the transmit/receive switch 26 shown in FIG. 4 while the sum of all phase shifts of all the phase shift elements 30 and 30' remains substantially 360 degrees.

Likewise, selected of the power-limiting elements 34' may provide for greater, in this example, or lesser coupling between the ring resonator 28 and the loops 12 of the coil 10 to accommodate differences in those loops 12 both in terms of loop area and proximity to the patient.

It is specifically intended that the present invention not be limited to the embodiments and illustrations contained herein, but include modified forms of those embodiments including portions of the embodiments and combinations of elements of different embodiments as come within the scope of the following claims.

We claim:

1. A coil for use with a magnetic resonance imaging (MRI) system comprising:
   a set of MRI antenna loops supported to be positioned about at least a portion of a patient;
   a set of transmit/receive switches alternatively connecting the antenna loops to a transmit signal from the MRI system and to at least one of the receiver inputs to the MRI system;
   a ring resonator forming an electrically conductive ring having series of phase splitting taps separated by phase shift elements;
   passive power-limiting circuits connected to the phase-splitting taps; and
   wherein the transmit signal from the MRI system is first coupled to the ring resonator and then through the phase splitting taps of the ring resonator and through the power-limiting circuits to each of the antenna loops so that coupling between the ring resonator and the antenna loops may be controlled by the passive-power limiting circuits.

2. The coil of claim 1 wherein the power-limiting circuits provide a non-reactive current limiting.

3. The coil of claim 1 wherein power-limiting circuits are 90-degree phase shift circuits.

4. The coil of claim 1 having N loops and wherein the ring resonator includes N phase shifting elements connected in series in a ring.

5. The coil of claim 4 having N loops and wherein the ring is non-circular.

6. The coil of claim 4 wherein the phase shifting elements employ tuned lengths of coaxial cable.

7. The coil of claim 6 wherein the power-limiting circuit is a 90-degree phase shift circuit requiring an inductance, and wherein the inductance is lumped into the inductance of the coaxial cable to eliminate a separate inductor.

8. The coil of claim 4 wherein the phase shifting elements employ tuned pi-networks.

9. The coil of claim 4 wherein each phase shifting element provides equal phase shift equal to 360/N degrees.

10. The coil of claim 4 wherein at least some phase shifting elements provides different phase shifts with phase shifts of all phase shifting elements totaling to 360 degrees.

11. The coil of claim 1 wherein each power-limiting circuit has a same electrical characteristic in order to provide equal coupling between each of the antenna loops and the ring resonator.

12. The coil of claim 1 wherein at least one of the power-limiting circuits has a different electrical characteristic in order to provide a different coupling between at least one antenna loop and the ring resonator.

13. The coil of claim 1 further including an interface circuit between the MRI machine and ring resonator coupling the transmit signal to the ring resonator as well as coupling combined NMR signals from the antenna loops from the ring resonator.

14. The coil of claim 1 wherein the antenna loops are supported about a circumference of a hollow cylinder.

15. The coil of claim 1 wherein the antenna loops are supported about a circumference of a first hollow tube and a second hollow tube intersecting at the first hollow tube at substantially right angles.

16. The coil of claim 1 wherein respective antenna loops are capacitively decoupled from each other.

17. A method of acquiring MRI signals using a coil having a set of MRI antenna loops, each communicating through a power-limiting circuit to a phase-splitting tap of a ring resonator, the ring resonator forming a conductive ring having a number of interconnected splitting taps separated by phase shift elements and connected to the MRI machine, the coil further including a set of transmit/receive switches alternatively connecting the set of MRI antenna loops to the ring resonator and to at least one of the receiver inputs to the MRI system, the method comprising the steps of:
(a) switching the transmit/receive switches in order to connect a respective antenna loop to the ring resonator and excite the respective antenna loop in a regular phase sequence matching that of the ring resonator; and
(b) switching the transmit/receive switches in order to connect the antenna loops to the receiver inputs of the MRI system and receive independent NMR signals from each antenna loop.

18. The method of claim 17 further including the step of: switching the transmit/receive switches in order to connect the antenna loops to the ring resonator and receive combined NMR signals from each antenna loop.

* * * * *